United States Patent
Kawakami et al.

(10) Patent No.: US 10,002,687 B2
(45) Date of Patent: Jun. 19, 2018

(54) TRANSPARENT CONDUCTIVE FILM

(71) Applicant: NITTO DENKO CORPORATION, Ibaraki-shi, Osaka (JP)

(72) Inventors: Rie Kawakami, Osaka (JP); Daiki Kato, Osaka (JP); Kazuaki Sassa, Osaka (JP); Hironobu Machinaga, Osaka (JP); Tsukasa Miyazaki, Osaka (JP); Eri Ueda, Osaka (JP)

(73) Assignee: NITTO DENKO CORPORATION, Ibaraki-shi (JP)

( * ) Notice: Subject to any disclaimer, the term of this patent is extended or adjusted under 35 U.S.C. 154(b) by 0 days. days.

(21) Appl. No.: 14/905,997

(22) PCT Filed: Mar. 11, 2015

(86) PCT No.: PCT/JP2015/057212
§ 371 (c)(1),
(2) Date: Jan. 19, 2016

(87) PCT Pub. No.: WO2015/166723
PCT Pub. Date: Nov. 5, 2015

(65) Prior Publication Data
US 2016/0155531 A1   Jun. 2, 2016

(30) Foreign Application Priority Data

Apr. 30, 2014 (JP) ................................ 2014-093487
May 20, 2014 (JP) ................................ 2014-104184
May 20, 2014 (JP) ................................ 2014-104609

(51) Int. Cl.
B32B 7/00 (2006.01)
B32B 27/06 (2006.01)
(Continued)

(52) U.S. Cl.
CPC ............. *H01B 5/14* (2013.01); *C23C 14/086* (2013.01); *H01B 3/10* (2013.01); *H01B 3/301* (2013.01);
(Continued)

(58) Field of Classification Search
CPC ..... Y10T 428/24364; Y10T 428/24366; Y10T 428/24612; Y10T 428/265; H01B 3/10;
(Continued)

(56) References Cited

U.S. PATENT DOCUMENTS

2006/0285213 A1   12/2006   Kanda et al.
2009/0315849 A1*  12/2009   Ito ........................... G06F 3/045
                                                          345/173
(Continued)

FOREIGN PATENT DOCUMENTS

JP   2002-163933 A   6/2002
JP   2002-371355 A   12/2002
(Continued)

OTHER PUBLICATIONS

Notification of Reasons for Refusal dated Jan. 19, 2016, issued in counterpart Japanese Patent Application No. 2015-556294, with English translation. (7 pages).
(Continued)

*Primary Examiner* — Joanna Pleszczynska
(74) *Attorney, Agent, or Firm* — Westerman, Hattori, Daniels & Adrian, LLP

(57) ABSTRACT

A transparent conductive film 1 includes a transparent substrate 2; a first optical adjustment layer 4 disposed on one side in the thickness direction of the transparent substrate 2 and made of a resin layer; an inorganic substance layer 5 disposed on one side in the thickness direction of the first optical adjustment layer 4 so as to make contact with the first optical adjustment layer 4; and a transparent conductive
(Continued)

layer 6 disposed on one side in the thickness direction of the inorganic substance layer 5. The inorganic substance layer 5 has a thickness of 10 nm or less, and the surface of the one side in the thickness direction of the transparent conductive layer 6 has a surface roughness of 1.40 nm or less.

12 Claims, 1 Drawing Sheet

(51) Int. Cl.
<br>  *B32B 27/08* (2006.01)
<br>  *H01B 1/06* (2006.01)
<br>  *H01B 1/08* (2006.01)
<br>  *H01B 3/30* (2006.01)
<br>  *H01B 5/14* (2006.01)
<br>  *H01B 3/10* (2006.01)
<br>  *H01B 3/38* (2006.01)
<br>  *H01B 3/42* (2006.01)
<br>  *H01B 3/44* (2006.01)
<br>  *C23C 14/08* (2006.01)
<br>  *G06F 3/041* (2006.01)

(52) U.S. Cl.
<br>  CPC .............. *H01B 3/305* (2013.01); *H01B 3/306* (2013.01); *H01B 3/307* (2013.01); *H01B 3/38* (2013.01); *H01B 3/423* (2013.01); *H01B 3/426* (2013.01); *H01B 3/427* (2013.01); *H01B 3/442* (2013.01); *H01B 3/447* (2013.01); *G06F 3/041* (2013.01)

(58) Field of Classification Search
<br>  CPC ......... H01B 3/301; H01B 3/305–3/307; H01B 3/38; H01B 3/423; H01B 3/426; H01B 3/427; H01B 3/442; H01B 3/447; H01B 5/14; H01B 1/06; H01B 1/08; B32B 7/00; B32B 27/06; B32B 27/08; B32B 2255/20
<br>  USPC .................. 428/212, 213, 689, 696, 702
<br>  See application file for complete search history.

(56) References Cited

U.S. PATENT DOCUMENTS

| | | |
|---|---|---|
| 2013/0280554 A1 | 10/2013 | Yamazaki et al. |
| 2013/0288047 A1 | 10/2013 | Kajihara et al. |
| 2014/0353140 A1 | 12/2014 | Haishi et al. |

FOREIGN PATENT DOCUMENTS

| | | |
|---|---|---|
| JP | 2005-103768 A | 4/2005 |
| JP | 2006-202756 A | 8/2006 |
| JP | 2012-134085 A | 7/2012 |
| JP | 2012-150779 A | 8/2012 |
| JP | 2013-107214 A | 6/2013 |
| JP | 2014-19038 A | 2/2014 |
| WO | 2004/105055 A1 | 12/2004 |
| WO | 2013/080995 A1 | 6/2013 |
| WO | 2014/020656 A1 | 2/2014 |

OTHER PUBLICATIONS

Decision of Refusal dated Aug. 23, 2016, issued in counterpart Japanese Patent Application No. 2015-556294, with English translation. (7 pages).

Second and Supplementary Notice Informing the Applicant of the Communication of the International Application (Form PCT/IB/308) dated Sep. 1, 2016, issued in counterpart International Application No. PCT/JP2015/057212. (1 page).

Notification Concerning Transmittal of International Preliminary Report on Patentability (Form PCT/IB/326) issued in counterpart International Application No. PCT/JP2015/057212 dated Nov. 10, 2016 with Forms PCT/IB/373, PCT/IB/338, and PCT/ISA/237. (18 pages).

International Search Report dated Jun. 2, 2015, issued in counterpart International Application No. PCT/JP2015/057212 (2 pages).

Notification of Reasons for Refusal dated May 26, 2016, issued in counterpart Japanese Patent Application No. 2015-556294, with English translation. (6 pages).

* cited by examiner

TRANSPARENT CONDUCTIVE FILM

TECHNICAL FIELD

The present invention relates to a transparent conductive film, in particular, to a transparent conductive film which is used for, for example, films for a touch panel.

BACKGROUND ART

Conventionally, it has been known that image display devices include a film for a touch panel and in the film, a transparent wiring layer composed of, for example, indium tin composite oxide (ITO) is formed. The film for a touch panel is produced generally by patterning the ITO layer into a wiring pattern, in a transparent conductive film in which, for example, an ITO layer is laminated on a transparent substrate (for example, see Patent Document 1).

Patent Document 1 discloses a transparent conductive laminate having a transparent substrate, a high refraction layer, a low refraction layer, and a transparent wiring layer, wherein the low refraction layer and the transparent wiring layer have uneven surfaces, and in both of the regions where the transparent wiring layer is formed and where the transparent wiring layer is not formed, the haze is 0.8 to 2.0%. In the transparent conductive laminate, the transparent wiring layer is formed to be invisible.

CITATION LIST

Patent Document

Patent Document 1: Japanese Unexamined Patent Publication No. 2013-107214

SUMMARY OF THE INVENTION

Problem to be Solved by the Invention

Recently, with demands for a larger size, thinner image display device, transparent conductive films have also been demanded to be larger and thinner. However, with a larger and thinner ITO layer of the transparent conductive film, the electric resistance of the ITO layer as a whole or a portion increases, and as a result, there are disadvantages in that functions such as sensitivity of the touch panel are reduced. Therefore, reduction (decrease in resistance) in specific resistance of the ITO layer has been demanded.

However, decrease in resistance cannot be achieved in the ITO layer of Patent Document 1.

An object of the present invention is to provide a transparent conductive film having an excellent specific resistance.

Means for Solving the Problem

A transparent conductive film of the present invention includes:
a transparent substrate,
a first optical adjustment layer disposed on one side in the thickness direction of the transparent substrate and made of a resin layer,
an inorganic substance layer disposed on one side in the thickness direction of the first optical adjustment layer so as to make contact with the first optical adjustment layer, and a transparent conductive layer disposed on one side in the thickness direction of the inorganic substance layer,
wherein the inorganic substance layer has a thickness of 10 nm or less, and
the surface of the one side in the thickness direction of the transparent conductive layer has a surface roughness of 1.40 nm or less.

In the transparent conductive film of the present invention, it is preferable that the first optical adjustment layer has a thickness of less than 200 nm.

In the transparent conductive film of the present invention, it is preferable that the first optical adjustment layer does not substantially contain particles.

In the transparent conductive film of the present invention, it is preferable that the surface of the one side in the thickness direction of the inorganic substance layer has a surface roughness of 0.20 nm or more and 0.70 nm or less.

It is preferable that the transparent conductive film of the present invention further includes a second optical adjustment layer,
wherein the second optical adjustment layer is disposed on one side in the thickness direction of the transparent substrate and on the other side in the thickness direction of the first optical adjustment layer, and
the second optical adjustment layer has a refraction that is different from the refraction of the first optical adjustment layer.

In the transparent conductive film of the present invention, it is preferable that the first optical adjustment layer has a refraction that is lower than the refraction of the second optical adjustment layer.

In the transparent conductive film of the present invention, it is preferable that the transparent conductive layer has a thickness of 25 nm or more and 40 nm or less.

In the transparent conductive film of the present invention, it is preferable that the transparent conductive layer has a specific resistance of $1.1 \times 10^{-4}$ $\Omega \cdot$cm or more and $2.5 \times 10^{-4}$ $\Omega \cdot$cm or less.

Effect of the Invention

The transparent conductive film of the present invention includes the transparent substrate, the first optical adjustment layer, the inorganic substance layer having a thickness of 10 nm or less, and the transparent conductive layer, and the surface of the one side in the thickness direction of the transparent conductive layer has a surface roughness of 1.40 nm or less, and therefore the transparent conductive layer has a reduced specific resistance, and has excellent specific resistance.

DESCRIPTION OF EMBODIMENTS

Figure 1:
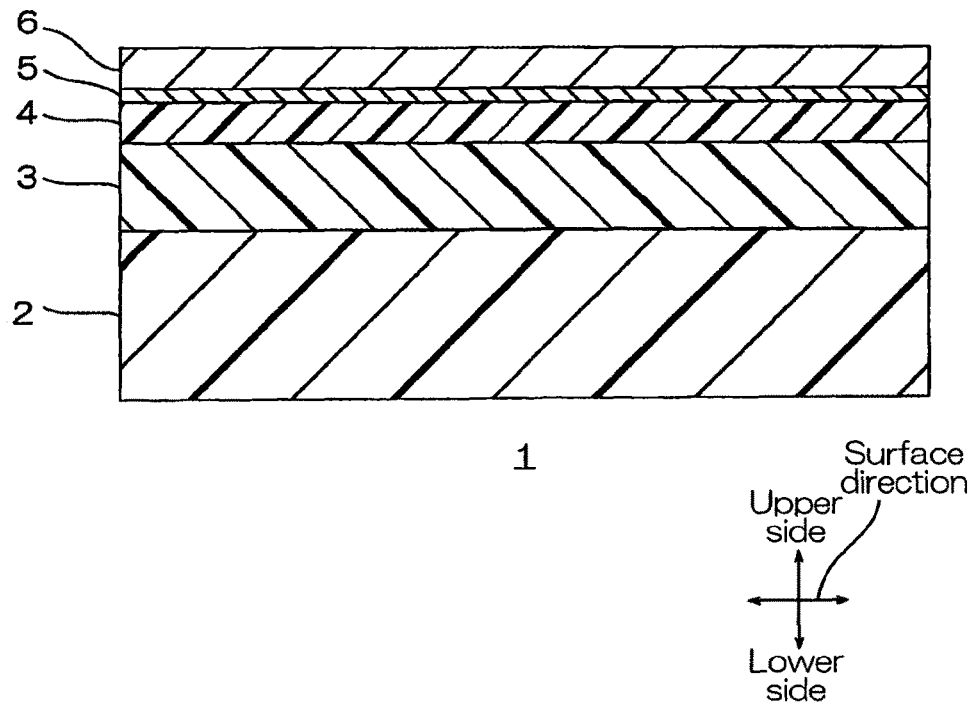
FIG. 1 shows a side sectional view of a transparent conductive film in one embodiment of the present invention.

In FIG. 1, up-down directions on the plane of the sheet are up-down directions (thickness direction, first direction), the upper side on the plane of the sheet is an upper side (one side in the thickness direction, one side in the first direction), the lower side on the plane of the sheet is a lower side (the other side in the thickness direction, the other side in the first direction).

A transparent conductive film 1 is formed into a film form (including sheet form), has a predetermined thickness, extends into a predetermined direction (surface direction) orthogonal to the thickness direction, and has a flat upper face and a flat lower face. The transparent conductive film 1 is a component of, for example, a substrate for a touch panel provided in image display devices. That is, the transparent conductive film 1 is not an image display device. That is, the transparent conductive film 1 is a component for producing, for example, an image display device; does not include an image display element such as an LCD module; consists of a transparent substrate 2, a second optical adjustment layer 3, a first optical adjustment layer 4, an inorganic substance layer 5, and a transparent conductive layer 6 to be described later; and solely distributed as a component and is an industrially applicable device.

To be specific, as shown in FIG. 1, the transparent conductive film 1 includes a transparent substrate 2, a second optical adjustment layer 3, a first optical adjustment layer 4, an inorganic substance layer 5, and a transparent conductive layer 6.

The transparent substrate 2 is, for example, a polymer film having transparency. Materials of the polymer film is not particularly limited, and the examples thereof include the following: for example, polyester resin such as polyethylene terephthalate (PET), polybutylene terephthalate, and polyethylenenaphthalate; (meth)acrylic resin such as polymethacrylate; olefin resins such as polyethylene, polypropylene, and cycloolefin polymer; polycarbonate resin, polyether sulfone resin, polyarylate resin, melamine resin, polyamide resin, polyimide resin, cellulose resin, polystyrene resin, and norbornene resin. These polymer films may be used singly, or may be used in a combination of two or more. Preferably, polyester resin is used in view of transparency, heat resistance, and mechanical properties.

The transparent substrate 2 has a thickness of, for example, 2 μm or more, preferably 20 μm or more, and for example, 200 μm or less, preferably 150 μm or less, in view of mechanical strength, abrasion resistance, and input characteristics when used for a substrate for a touch panel.

The second optical adjustment layer 3 is disposed, for example, on an upper face of the transparent substrate 2 (surface of one side in the thickness direction). To be specific, the lower side of the second optical adjustment layer 3 is in contact with the upper face of the transparent substrate 2.

The second optical adjustment layer 3 is a resin layer formed from a second resin composition.

The second resin composition contains, for example, resin. The second resin composition preferably contains resin and particles, even more preferably, consists of resin and particles.

Examples of the resin include curable resin and thermoplastic resin (for example, polyolefin resin), preferably, curable resin is used, without limitation.

Examples of the curable resin include an active energy ray curable resin that is cured by application of an active energy ray (to be specific, ultraviolet ray, electron beam, etc.) and for example, a thermosetting resin that is cured by heat, and preferably, an active energy ray curable resin is used.

Examples of the active energy ray curable resin include a polymer having a functional group having a polymerizable carbon-carbon double bond in the molecule. Examples of such a functional group include a vinyl group, and a (meth)acryloyl group (methacryloyl group and/or acryloyl group).

Examples of the active energy ray curable resin include functional group-containing (meth)acrylic resin (acrylic resin and/or methacrylic resin).

These resins may be used singly, or may be used in combination of two or more.

The resin content relative to the second resin composition is, for example, 10 mass % or more, preferably 50 mass % or more, and for example, 95 mass % or less, preferably 90 mass % or less.

Examples of the particles include inorganic particles and organic particles. Examples of the inorganic particles include silica particles, metal oxide particles composed of zirconium oxide and titanium oxide; and carbonate particles such as calcium carbonate. Examples of the organic particles include crosslinked acrylic resin particles.

For the particles, preferably, inorganic particles, more preferably, metal oxide particles, even more preferably, zirconium oxide particles ($ZnO_2$) are used.

The particles have an average particle size of, for example, 10 nm or more, preferably 20 nm or more, and for example, 500 nm or less, preferably 100 nm or less.

In the present invention, the average particle size of the particles can be measured by Coulter counting method using a Coulter Multisizer manufactured by Beckman Coulter, Inc.

The second optical adjustment layer 3 has a refraction of, for example, 1.50 or more, preferably 1.60 or more, and for example, 1.80 or less, preferably 1.75 or less.

In the present invention, the refraction is measured by an Abbe refractometer.

The second optical adjustment layer 3 has a thickness of, for example, 30 nm or more, preferably 50 nm or more, and for example, 1000 nm or less, preferably 500 nm or less, in view of less visibility and low resistance of the wiring pattern.

The thickness of the second optical adjustment layer 3 is measured, for example, by observation of cross sections with a transmission electron microscope (TEM).

The first optical adjustment layer 4 is disposed, for example, on the upper face of the second optical adjustment layer 3. To be specific, the lower face of the first optical adjustment layer 4 is in contact with the upper face of the second optical adjustment layer 3.

The first optical adjustment layer 4 is a resin layer formed from a first resin composition.

The first resin composition contains resin, preferably is composed substantially of resin, more preferably, consists of resin.

The resin is selected from those resins given as examples of the second resin composition. For the resin, preferably, thermosetting resin is used.

Examples of the thermosetting resin include, without limitation, silicone resin, epoxy resin, urethane resin, polyimide resin, phenol resin, urea resin, melamine resin, and unsaturated polyester resin. Preferably, epoxy resin and melamine resin are used, more preferably, epoxy resin is used.

Examples of the epoxy resin include thermosetting epoxy resin, to be specific, bisphenol epoxy resins such as bisphenol A, bisphenol F, and bisphenol S epoxy resins; novolak epoxy resins such as phenol novolak and cresol novolak epoxy resins; nitrogen-containing cyclic epoxy resins such as triglycidyl isocyanurate and hydantoin; naphthalene epoxy resin; biphenyl epoxy resin; glycidyl ether epoxy resin; dicyclo epoxy resin; ester epoxy resin; and modified products or hydrogenated products of these.

To the epoxy resin, a curing agent such as thermosetting resin can be blended and the epoxy resin and the curing agent can be prepared as an epoxy resin composition.

Examples of the curing agent include, without limitation, as a curing agent for epoxy resin, an amine-based curing agent, amide-based curing agent, acid anhydride-based curing agent, dihydrazide-based curing agent, urea-based curing agent, imidazole-based curing agent, and imidazoline-based curing agent.

The mixing ratio of the curing agent relative to 100 parts by mass of the epoxy resin is, for example, 0.5 parts by mass or more, preferably 1.0 part by mass or more, and for example, 10 parts by mass or less, preferably 9 parts by mass or less.

The first resin composition (and the first optical adjustment layer 4) preferably does not substantially contain particles. The upper face of the first optical adjustment layer 4 can be made smooth in this manner, and therefore the inorganic substance layer 5 and the transparent conductive layer 6 can be made smoother, and the specific resistance of the transparent conductive layer 6 can be reduced even more.

Examples of the particles include the above-described particles given as examples for the second resin composition.

The first resin composition does not substantially contain particles means that the particle content relative to a total solid content of the first resin composition is, for example, less than 1 mass %, preferably less than 0.5 mass %, more preferably less than 0.1 mass %, even more preferably 0 mass %.

The first optical adjustment layer 4 has a refraction that is different from the refraction of the second optical adjustment layer 3. The difference between the refraction of the first optical adjustment layer 4 and the refraction of the second optical adjustment layer 3 is, for example, 0.10 or more and 0.60 or less.

Preferably, the refraction of the first optical adjustment layer 4 is lower than the refraction of the second optical adjustment layer 3. That is, preferably, the second optical adjustment layer 3 is the high refraction layer, and the first optical adjustment layer 4 is the low refraction layer having a refraction that is lower than the refraction of the high refraction layer. In this manner, a difference can be reduced in reflectivity and in hue between the wiring pattern and the portion other than the wiring pattern caused when the transparent conductive layer 6 of the transparent conductive film 1 is patterned to form a wiring pattern, and visibility of the wiring pattern can be reduced.

The refraction of the first optical adjustment layer 4 is, to be specific, for example, less than 1.60, preferably 1.55 or less, and for example, 1.20 or more, preferably 1.30 or more.

The surface roughness of the upper face of the first optical adjustment layer 4 is, for example, 1.5 nm or less, preferably 1.0 nm or less, and for example, 0.1 nm or more.

The first optical adjustment layer 4 has a thickness of, for example, less than 200 nm, preferably 100 nm or less, more preferably 50 nm or less, and for example, 5 nm or more, preferably 10 nm or more. The thickness of the first optical adjustment layer 4 being the above-described lower limit or less allows for the upper face of the first optical adjustment layer 4 to be smooth, and the amount of gas discharged from inside of the first optical adjustment layer 4 to enter into the transparent conductive layer 6 can be reduced. The specific resistance of the transparent conductive layer 6 can be reliably reduced in this manner.

The thickness of the first optical adjustment layer 4 can be measured, for example, by observation of cross sections with a transmission electron microscope (TEM).

The ratio of the thickness of the first optical adjustment layer 4 relative to the thickness of the second optical adjustment layer 3 (first optical adjustment layer 4/second optical adjustment layer 3) is, in view of reduction of visibility of the wiring pattern, for example, 0.01 or more, preferably 0.05 or more, and for example, 1.50 or less, preferably 1.00 or less.

The inorganic substance layer 5 is disposed on the upper face of the first optical adjustment layer 4. To be specific, the lower face of the inorganic substance layer 5 is in contact with the upper face of the first optical adjustment layer 4.

Examples of the inorganic substance that forms the inorganic substance layer 5 include, without limitation, alkali metal fluorides such as NaF, $Na_3AlF_6$, LiF, and $MgF_2$; alkaline earth metal fluorides such as $CaF_2$ and $BaF_2$; rare-earth element fluorides such as $LaF_3$ and CeF; and oxides such as $SiO_2$ and $Al_2O_3$. The inorganic substance can be used singly or can be used in combination of two or more.

In view of reduction of visibility and low resistance of the wiring pattern, preferably, oxide is used, and more preferably, $SiO_2$ is used.

The inorganic substance layer 5 has a thickness of 10 nm or less. Preferably, the inorganic substance layer 5 has a thickness of 4 nm or less, more preferably 3 nm or less, and for example, 1 nm or more, preferably 2 nm or more.

By disposing the inorganic substance layer 5 having a thickness in the above-described range on the upper face of the first optical adjustment layer 4 to make contact, the surface roughness of the upper face of the inorganic substance layer 5 is reduced, and the lower face and the upper face of the transparent conductive layer 6 disposed on the upper face of the inorganic substance layer 5 can be made smooth. As a result, the specific resistance of the transparent conductive layer 6 can be reduced.

This is probably because when the inorganic substance layer 5 is formed on the first optical adjustment layer 4, the inorganic substance forming the inorganic substance layer 5 is disposed (formed) first so as to fill the depressions (gaps) of the projections and depressions of the first optical adjustment layer 4, and therefore in a very thin inorganic substance layer 5, the inorganic substance is disposed so that the upper face of the inorganic substance layer 5 is smooth (surface roughness is small). Meanwhile, when the inorganic substance layer 5 is continued to be formed so that the thickness is more than the above-described upper limit, the upper face of the inorganic substance is eventually formed so as to follow the shape (projections and depressions) of the upper face of the first optical adjustment layer 4, and as a result, projections and depressions are caused on the upper face of the inorganic substance layer 5 as well.

The thickness of the inorganic substance layer 5 is measured, for example, by cross section observation with a transmission electron microscope (TEM).

The ratio of the thickness of the inorganic substance layer 5 relative to the thickness of the optical adjustment layers (second optical adjustment layer 3 and first optical adjustment layer 4) (inorganic substance layer 5/optical adjustment layers) is, in view of reduction in visibility and low resistance of the wiring pattern, for example, 0.001 or more, preferably 0.005 or more, and for example, 0.30 or less, preferably 0.25 or less.

The ratio of the thickness of the inorganic substance layer 5 relative to the thickness of the first optical adjustment layer 4 (inorganic substance layer 5/first optical adjustment layer 4) is, in view of reduction in visibility and low resistance of the wiring pattern, for example, 0.02 or more, preferably 0.05 or more, and for example, 2.00 or less, preferably 1.00 or less.

The upper face of the inorganic substance layer 5 has a surface roughness of, for example, 0.70 nm or less, preferably 0.60 nm or less, more preferably 0.50 nm or less, and for example, 0.20 nm or more. Setting the surface roughness of the upper face of the inorganic substance layer 5 to the above-described upper limit or less allows for smoother transparent conductive layer 6, and the specific resistance of the transparent conductive layer 6 can be reduced. Meanwhile, setting the surface roughness of the inorganic substance layer 5 to the above-described lower limit or more allows for suppressing cracks of the transparent conductive layer 6 caused at the time of heating or at the time of moisturization and heating.

In the present invention, the surface roughness is measured by an atomic force microscope.

The transparent conductive layer 6 is disposed on the upper face of the inorganic substance layer 5. To be specific, the lower face of the transparent conductive layer 6 is in contact with the upper face of the inorganic substance layer 5.

Examples of the material for the transparent conductive layer 6 include metal oxide including at least one metal selected from the group consisting of In, Sn, Zn, Ga, Sb, Ti, Si, Zr, Mg, Al, Au, Ag, Cu, Pd, and W. As necessary, the metal oxide may be doped with metal atoms of the above-described group.

For the material of the transparent conductive layer 6, preferably, indium tin composite oxide (ITO) and antimony tin composite oxide (ATO) are used, and more preferably, ITO is used.

When ITO is used as the material of the transparent conductive layer 6, the tin oxide ($SnO_2$) content relative to a total amount of tin oxide and indium oxide ($In_2O_3$) is, for example, 0.5 mass % or more, preferably 3 mass % or more, and for example, 15 mass % or less, preferably 13 mass % or less. Setting the tin oxide content to the above-described lower limit or more allows for more excellent durability of the ITO layer. Setting the tin oxide content to the above-described upper limit or less allows for easy crystallization of the ITO layer, and improvement in stability of transparency and specific resistance.

The "ITO" in this description may be sufficient as long as it is composite oxide containing at least indium (In) and tin (Sn), and may include additional components other than In and Sn. Examples of the additional component include metal elements other and In and Sn, to be specific, for example, Zn, Ga, Sb, Ti, Si, Zr, Mg, Al, Au, Ag, Cu, Pd, W, Fe, Pb, Ni, Nb, Cr, and Ga.

The transparent conductive layer 6 has a thickness of, for example, 15 nm or more, preferably 20 nm or more, more preferably 25 nm or more, and for example, 50 nm or less, preferably 40 nm or less, more preferably 35 nm or less. By setting the thickness of the transparent conductive layer 6 to the above-described lower limit or more, the transparent conductive layer 6 of, for example, an ITO layer can be homogeneously crystallized at the time of heating. Meanwhile, by setting the thickness of the transparent conductive layer 6 to the above-described upper limit or less, increase in specific resistance due to increase in surface roughness of the upper face of the transparent conductive layer 6 can be suppressed, and natural crystallization of the transparent conductive layer 6, for example, an ITO layer, at room temperature can be suppressed.

The thickness of the transparent conductive layer 6 can be calculated, for example, by measuring X-ray reflectivity with a powder X-ray diffraction device.

The ratio of the thickness of the transparent conductive layer 6 relative to the thickness of the inorganic substance layer 5 (transparent conductive layer 6/inorganic substance layer 5) is, in view of reduction in visibility and low resistance of the wiring pattern, for example, 2.0 or more, preferably 2.5 or more, and for example, 30 or less, preferably 10 or less, more preferably 9 or less.

The transparent conductive layer 6 can be any of crystalline and amorphous, and can be a mixture of crystalline and amorphous. The transparent conductive layer 6 is preferably crystalline, to be more specific, the transparent conductive layer 6 is a crystalline ITO layer. The transparency of the transparent conductive layer 6 can be improved in this manner, and the specific resistance of the transparent conductive layer 6 can be reduced even more.

The surface roughness of the upper face of the transparent conductive layer 6 is 1.40 nm or less. Preferably, the surface roughness of the upper face of the transparent conductive layer 6 is 0.90 nm or less, more preferably 0.70 nm or less, even more preferably, less than 0.40 nm. When the surface roughness of the transparent conductive layer 6 is more than the above-described upper limit, projections and depressions of the upper face of the transparent conductive layer 6 increase, and therefore the specific resistance of the transparent conductive layer 6 increases.

On the lower face of the transparent substrate 2 (surface on the other side in the thickness direction), as necessary, for example, a hard coat layer, a blocking prevention layer, an adhesion facilitation layer, an adhesive layer, and a separator can be provided.

A method for producing the transparent conductive film 1 is described next.

To produce the transparent conductive film 1, for example, a second optical adjustment layer 3, a first optical adjustment layer 4, an inorganic substance layer 5, and a transparent conductive layer 6 are provided in sequence on the transparent substrate 2. Detailed description is given below.

First, a known or commercially available transparent substrate 2 is prepared.

Thereafter, in view of adhesion of the transparent substrate 2 and the second optical adjustment layer 3, as necessary, for example, etching treatment and primer application such as sputtering, corona discharge, flame treatment, ultraviolet ray application, electron beam application, chemical conversion coating, and oxidation can be performed, on the surface of the transparent substrate 2. Furthermore, dust can be removed from the transparent substrate 2 and the transparent substrate 2 can be cleaned by, for example, solvent washing and ultrasonic washing.

Then, by applying the second resin composition on the transparent substrate 2 by wet processing, the second optical adjustment layer 3 is formed on the upper face of the transparent substrate 2.

To be specific, a second diluted solution, which is a solution of the second resin composition diluted with a solvent, is prepared, and then the second diluted solution is applied on the upper face of the transparent substrate 2 and the second diluted solution is dried.

Examples of the solvent include, without limitation, for example, an organic solvent and a water-based solvent (to be specific, water), and preferably, an organic solvent is used. Examples of the organic solvent include alcohol compounds such as methanol, ethanol, and isopropyl alcohol; ketone compounds such as acetone, methyl ethyl ketone, and methylisobutylketone (MIBK); ester compounds such as ethyl acetate and butyl acetate; and aromatic compounds such as toluene and xylene. Preferably, ketone compounds are used. The solvent can be used singly or can be used in combination of two or more.

The diluted solution has a solid content concentration of, for example, 0.5 mass % or more and 5.0 mass % or less.

Examples of the application method include fountain coating, die coating, spin coating, spray coating, gravure coating, roll coating, and bar coating.

The drying temperature is, for example, 60° C. or more, preferably 80° C. or more, and for example, 250° C. or less, preferably 200° C. or less.

The drying time is, for example, 1.0 minute or more, preferably 2.0 minutes or more, and for example, 1.0 hours or less, preferably 0.5 hours or less.

The above-described application and drying form a film of the second resin composition on the upper face of the transparent substrate 2.

Thereafter, when the resin of the second resin composition contains the active energy ray curable resin, after drying the second diluted solution, an active energy ray is applied to cure the active energy ray curable resin.

When the thermosetting resin is contained as the resin of the second resin composition, this drying step dries the solvent and at the same time the thermosetting resin can be cured by heat.

Then, by applying the first resin composition on the second optical adjustment layer 3 by, for example, wet processing, the first optical adjustment layer 4 is formed on the upper face of the second optical adjustment layer 3.

To be specific, a first diluted solution, which is a solution of the first resin composition diluted with a solvent, is prepared, and then the first diluted solution is applied on the upper face of the second optical adjustment layer 3 and the first diluted solution is dried.

Examples of the solvent, dilution method, application method, and drying method include those given as examples for the solvent and application methods for the second diluted solution of the second resin composition.

When the thermosetting resin is contained as the resin of the first resin composition, this drying step dries the solvent and at the same time the thermosetting resin can be cured by heat.

Meanwhile, when the resin of the first resin composition contains the active energy ray curable resin, after drying the first diluted solution, an active energy ray can be applied to cure the active energy ray curable resin.

Then, an inorganic substance layer 5 is formed on the upper face of the first optical adjustment layer 4 by dry processing.

Examples of the dry processing include vacuum deposition, sputtering, and ion plating. Preferably, sputtering is used. To be specific, magnetron sputtering is used. By forming the inorganic substance layer 5 with this method, a high density inorganic substance layer 5 can be formed. Therefore, entrance of impurity gas such as organic gas and water discharged from the transparent substrate 2 of, for example, a polymer film, into the transparent conductive layer 6 can be suppressed, and specific resistance of the transparent conductive layer 6 can be decreased.

When using sputtering, examples of the target material include the aforementioned inorganic substances that form the inorganic substance layer 5, and preferably Si is used.

Examples of the sputtering gas include an inert gas such as Ar.

When the inorganic substance layer 5 contains oxide, as necessary, a reactive gas such as oxygen gas can be used in combination. When the reactive gas is used in combination, the flow ratio of the reactive gas is not particularly limited, but is, for example, 0.1 flow rate % or more to 40 flow rate % or less relative to the flow ratio of the total of the sputtering gas and the reactive gas.

The electric discharge atmospheric pressure at the time of sputtering is, in view of suppressing reduction in sputtering rate and electric discharge stability, for example, 1 Pa or less, preferably 0.1 Pa or more and 0.7 Pa or less.

The power source used for sputtering can be, for example, any of a DC power source and a RF power source, and can be a combination of these.

The horizontal magnetic field intensity of the target material surface is, for example, 20 mT or more, preferably 50 mT or more, even more preferably, 70 mT or more in view of the film-forming speed, and suppression of intake of inert gas (Ar atoms, etc.) to the inorganic substance layer.

Degassing treatment can be performed before forming the inorganic substance layer 5. In this manner, impurity gas discharged from the transparent substrate 2 of, for example, a polymer film can be removed.

For degassing, for example, the transparent substrate 2 on which the second optical adjustment layer 3 and the first optical adjustment layer 4 are formed is allowed to stand under vacuum. The pressure under vacuum is, for example, $1 \times 10^{-1}$ Pa or less, preferably $1 \times 10^{-3}$ Pa or less.

Then, the transparent conductive layer 6 is formed on the upper face of the inorganic substance layer 5.

For the formation of the transparent conductive layer 6, the above-described dry processing is used, preferably, sputtering is used. For the formation of the transparent conductive layer 6, particularly preferably, magnetron sputtering is used.

When sputtering is used, examples of the target material include the aforementioned metal oxide that forms the transparent conductive layer 6, and preferably, ITO is used. The ITO has a tin oxide concentration of, in view of durability and crystallization of the ITO layer, for example, 0.5 mass % or more, preferably 3 mass % or more, and for example, 15 mass % or less, preferably 13 mass % or less.

Examples of the sputtering gas include inert gas such as Ar. As necessary, reactive gas such as oxygen gas can be used in combination. When using reactive gas in combination, the flow ratio of the reactive gas is not particularly limited, but relative to the flow ratio of a total of the sputtering gas and the reactive gas, the flow ratio of the reactive gas is, for example, 0.1 flow rate % or more and 5 flow rate % or less.

The electric discharge atmospheric pressure at the time of sputtering is, in view of suppressing reduction in sputtering rate and electric discharge stability, for example, 1 Pa or less, preferably 0.1 Pa or more and 0.7 Pa or less.

The power source used for sputtering can be, for example, any one of a DC power source and a RF power source, and can be a combination of these.

The horizontal magnetic field intensity of the target material surface is, for example, 20 mT or more, preferably 50 mT or more, even more preferably, 70 mT or more in view of film-forming speed, and suppression of intake of inert gas (Ar atoms, etc.) to the transparent conductive layer.

The transparent conductive film 1 is produced is this manner.

Then, as necessary, crystallization is performed on the transparent conductive layer 6 of the transparent conductive film 1.

To be specific, the transparent conductive film 1 is heated in the atmosphere.

The heating can be performed, for example, by using, for example, an infrared heater and an oven.

The heating temperature is, for example, 100° C. or more, preferably 120° C. or more, and for example, 200° C. or less, preferably 160° C. or less. By setting the heating temperature within the above-described range, damages of the transparent substrate 2 from heat and impurities generated from the transparent substrate 2 can be suppressed, while ensuring crystallization.

The heating time is suitably decided in accordance with the heating temperature, but for example, 10 minutes or more, preferably 30 minutes or more, and for example, 5 hours or less, preferably 3 hours or less.

The transparent conductive film 1 including the crystallized transparent conductive layer 6 is produced in this manner.

The specific resistance of the transparent conductive layer 6 of the thus produced transparent conductive film 1 is, for example, $1.1 \times 10^{-4}$ Ω·cm or more, preferably $1.2 \times 10^{-4}$ Ω·cm or more, and for example, $2.5 \times 10^{-4}$ Ω·cm or less, preferably $2.0 \times 10^{-4}$ Ω·cm or less, more preferably $1.8 \times 10^{-4}$ Ω·cm or less.

The specific resistance is calculated by measuring the surface resistance of the transparent conductive layer 6 by four terminal sensing, and calculating the measured surface resistance and the thickness of the transparent conductive layer 6.

The transparent conductive film 1 has a total thickness of, for example, 2 µm or more, preferably 20 µm or more, and for example, 200 µm or less, preferably 150 µm or less.

As necessary, before or after the crystallization, the transparent conductive layer 6 can be formed into a wiring pattern of, for example, stripes by a known etching method.

In the above-described production method, the second optical adjustment layer 3, the first optical adjustment layer 4, the inorganic substance layer 5, and the transparent conductive layer 6 can be sequentially formed on the upper face of the transparent substrate 2 by roll-to-roll method while transporting the transparent substrate 2, or a part of the layers or the whole layers can be formed by batch processing.

The transparent conductive film 1 includes the transparent substrate 2, the second optical adjustment layer 3, the first optical adjustment layer 4, the inorganic substance layer 5, and the transparent conductive layer 6 in this sequence. Therefore, arrival and entrance of impurity gas generated (for example, generated at the time of crystallization) from the transparent substrate 2 into the transparent conductive layer 6 can be suppressed.

Furthermore, the inorganic substance layer 5 has a thickness of 10 nm or less, and therefore by smoothing the projections and depressions caused in the first optical adjustment layer 4, surface roughness of the upper face of the inorganic substance layer 5 and the lower face of the transparent conductive layer 6 is reduced.

Furthermore, the surface roughness of the upper face of the transparent conductive layer 6 is 1.40 nm or less.

Thus, in the transparent conductive film 1, the specific resistance of the transparent conductive layer 6 is reduced. Therefore, with the transparent conductive film 1, excellent conductive characteristics are provided even if it is made to be large or thin, and therefore when used as a substrate for a large or a thin touch panel, reductions in functions of a touch panel such as sensitivity can be suppressed.

The transparent conductive film 1 can be suitably used for various uses, especially for a substrate for a touch panel. The touch panel can be a touch panel of various forms including optical type, ultrasonic wave type, capacitive type, and resistive film type, and especially used suitably for capacitive type touch panel.

Modified Example

Figure 2:
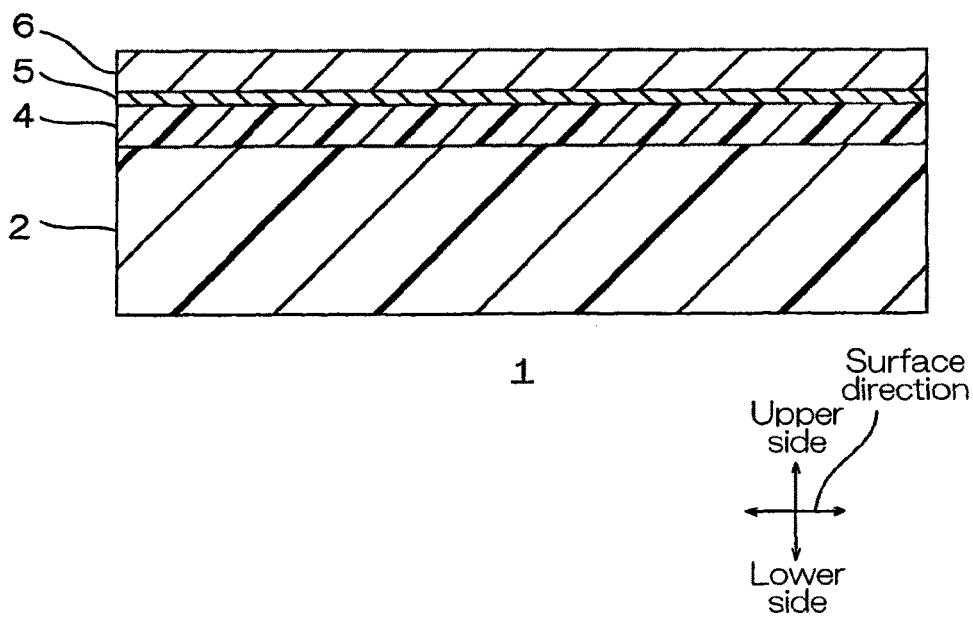
FIG. 2 shows a side sectional view of a transparent conductive film in another embodiment of the present invention (embodiment in which no second optical adjustment layer is included).

In the embodiment of FIG. 1, the transparent conductive film 1 includes the transparent substrate 2, the second optical adjustment layer 3, the first optical adjustment layer 4, the inorganic substance layer 5, and the transparent conductive layer 6, but for example, as shown in FIG. 2, the transparent conductive film 1 can also be configured from the transparent substrate 2, the first optical adjustment layer 4, the inorganic substance layer 5, and the transparent conductive layer 6.

That is, the transparent conductive film 1 of FIG. 2 includes the transparent substrate 2, the first optical adjustment layer 4 disposed on the transparent substrate 2, the inorganic substance layer 5 disposed on the first optical adjustment layer 4, and the transparent conductive layer 6 disposed on the inorganic substance layer 5, and the second optical adjustment layer 3 is not included.

Furthermore, in the embodiment of FIG. 1, the first optical adjustment layer 4 is brought into contact with the upper face of the second optical adjustment layer 3, but it is not limited thereto. For example, although it is not shown, it is also possible to interpose another layer between the first optical adjustment layer 4 and the second optical adjustment layer 3 without allowing the first optical adjustment layer 4 to be in contact with the upper face of the second optical adjustment layer 3.

Furthermore, in the embodiment of FIG. 1, the second optical adjustment layer 3 is brought into contact with the upper face of the transparent substrate 2, but it is not limited thereto. For example, although not shown, it is also possible to interpose another layer between the second optical adjustment layer 3 and the transparent substrate 2 without allowing the second optical adjustment layer 3 to be in contact with the upper face of the transparent substrate 2.

In the present invention, in view of reduction of visibility of the wiring pattern, preferably, the transparent conductive film 1 of FIG. 1 is used.

EXAMPLES

In the following, the present invention is described in further details with reference to on Examples and Comparative Examples. However, the present invention is not limited to Examples and Comparative Examples. The specific numeral values such as mixing ratios (contents), physical property values, and parameters used in the following description can be replaced with the upper limit values (numeral values defined with "or less" and "less than") or lower limit values (numeral values defined with "or more" and "more than") of corresponding mixing ratios (contents), physical property values, and parameters in the above-described "DESCRIPTION OF EMBODIMENTS".

Example 1

(Transparent Substrate)

For the transparent substrate, a polyethylene terephthalate (PET) film (manufactured by Mitsubishi Plastics, Inc., trade name "Diafoil", thickness 50 µm) was used.

(Formation of Second Optical Adjustment Layer)

An ultraviolet ray curable resin composition (second resin composition) consisting of an ultraviolet ray curable acrylic resin and zirconium oxide ($ZnO_2$) particles (average particle size 20 nm) were diluted with methylisobutylketone (MIBK) so that the solid content concentration was 5 mass %, thereby preparing a second diluted solution of the ultraviolet ray curable resin composition. Then, the second diluted solution was applied on the upper face of the PET film and dried, thereby forming the ultraviolet ray curable resin composition into a film. Then, ultraviolet ray was applied to the ultraviolet ray curable resin composition to be cured. A second optical adjustment layer having a thickness of 200 nm was formed on the upper face of the PET film in this manner.

(Formation of First Optical Adjustment Layer)

A thermosetting resin composition (first resin composition) composed of 100 parts by mass of a thermosetting epoxy resin and 1 part by mass of a thermosetting resin curing agent (curing agent for epoxy resin) was diluted with methylisobutylketone (MIBK) so that the solid content concentration was 0.8 mass %, thereby preparing a first diluted solution of the thermosetting resin composition. Then, the first diluted solution was applied on the upper face of the first optical adjustment layer, and heated at 195° C. for 1 minute for drying and cured. The first optical adjustment layer having a thickness of 25 nm was formed on the upper face of the second optical adjustment layer in this manner.

An optical adjustment layer formed PET film including the first optical adjustment layer, the second optical adjustment layer, and the PET film was produced in this manner.

(Degassing)

The optical adjustment layer formed PET film produced as described above was attached to a vacuum sputtering device, and was wound up with a heated film-forming roll while allowing the film to be in contact and running the film. While running the film, a vacuum system including a cryocoil and a turbomolecular pump was used to allow the degree of vacuum in the atmosphere to be $1 \times 10^{-4}$ Pa.

(Formation of Inorganic Substance Layer)

While keeping the vacuum state, an $SiO_2$ layer as an inorganic substance layer was formed on the upper face of the first optical adjustment layer of the degassed optical adjustment layer formed PET film by DC magnetron sputtering. In the sputtering, Si was used as the target material, and a reduced pressure atmosphere (0.2 Pa) to which Ar and $O_2$ ($O_2$ flow ratio 30%) were introduced was used, and the horizontal magnetic field was adjusted to 100 mT. The formed $SiO_2$ layer had a thickness of 1 nm.

(Formation of ITO Layer)

While keeping the vacuum state, the indium tin composite oxide (ITO) layer was formed on the upper face of the $SiO_2$ layer of the film produced as described above ($SiO_2$ layer/ first optical adjustment layer/second optical adjustment layer/PET film) by DC magnetron sputtering. In the sputtering, ITO having a tin oxide concentration of 10 mass % was used as the target material, and a reduced pressure atmosphere (0.4 Pa) to which Ar and $O_2$ ($O_2$ flow ratio 0.5%) were introduced was used, and the horizontal magnetic field was adjusted to 100 mT. The formed ITO layer was amorphous, and had a thickness of 26 nm.

(Crystallization)

Then, the film in which the amorphous ITO layer was formed as described above was taken out from the sputtering device, and heated in an oven of 150° C. for 120 minutes. A transparent conductive film of Example 1 in which a crystalline ITO layer (thickness 26 nm) was formed as a transparent conductive layer was produced (ref: FIG. 1).

Example 2

A transparent conductive film was produced in the same manner as in Example 1, except that the thickness of the inorganic substance layer ($SiO_2$ layer) was set to 2 nm.

Example 3

A transparent conductive film was produced in the same manner as in Example 1, except that the thickness of the inorganic substance layer ($SiO_2$ layer) was set to 3 nm.

Example 4

A transparent conductive film was produced in the same manner as in Example 1, except that the thickness of the inorganic substance layer ($SiO_2$ layer) was set to 4 nm.

Example 5

A transparent conductive film was produced in the same manner as in Example 1, except that the thickness of the inorganic substance layer ($SiO_2$ layer) was set to 6 nm.

Example 6

A transparent conductive film was produced in the same manner as in Example 1, except that the thickness of the inorganic substance layer ($SiO_2$ layer) was set to 9 nm.

Example 7

A transparent conductive film was produced in the same manner as in Example 3, except that the second optical adjustment layer was not formed.

Example 8

A transparent conductive film was produced in the same manner as in Example 7, except that the thickness of the first optical adjustment layer was set to 100 nm.

Comparative Example 1

A transparent conductive film was produced in the same manner as in Example 1, except that the inorganic substance layer was not formed.

Comparative Examples 2 to 4

A transparent conductive film was produced in the same manner as in Example 1, except that the thickness of the inorganic substance layer was set to 11 nm, 15 nm, and 20 nm.

Comparative Example 5

A transparent conductive film was produced in the same manner as in Comparative Example 1, except that the first optical adjustment layer was formed as described below.

Hollow nano-silica particle-containing acrylate resin (silica average particle size 45 nm, silica content 80 mass %) and methylisobutylketone (MIBK) were mixed, thereby preparing a particle-containing resin mixture liquid having a solid content concentration of 1.5 mass %. The particle-containing resin mixture liquid was subjected to 5 minutes of ultrasonic dispersion so that the components were dispersed homogeneously. The dispersed particle-containing resin mixture liquid was applied on the upper face of the second optical adjustment layer with a bar coater, dried in an 80° C. oven for 1 minute, and then irradiated with UV (accumulated exposure 300 mJ), thereby forming a first optical adjustment layer (thickness 25 nm, particle-containing optical adjustment layer).

Comparative Example 6

A transparent conductive film was produced in the same manner as in Example 3, except that the first optical adjustment layer (thickness 25 nm, particle-containing optical adjustment layer) in the above-described Comparative Example 5 was used as the first optical adjustment layer.

Comparative Example 7

A transparent conductive film was produced in the same manner as in Example 3, except that with DC magnetron sputtering, a $Nb_2O_5$ layer having a thickness of 20 nm was formed as the second optical adjustment layer, and a $Al_2O_3$ layer having a thickness of 25 nm was formed as the first optical adjustment layer.

(Thickness of Inorganic Substance Layer, First Optical Adjustment Layer, and Second Optical Adjustment Layer)

The thickness of the inorganic substance layer, the first optical adjustment layer, and the second optical adjustment layer was measured by measuring the cross section of the transparent conductive film with a transmission electron microscope (TEM).

(Refraction of First Optical Adjustment Layer and Second Optical Adjustment Layer)

After forming the first optical adjustment layer and the second optical adjustment layer, measurement was conducted using an Abbe refractometer manufactured by Atago Co., Ltd. using a predetermined measurement method shown in the refractometer under a conditions of 25.0° C., while allowing the measurement light (wavelength: 589.3 nm) to enter the measurement plane. Table 1 shows the results.

(Measurement of Thickness of Transparent Conductive Layer)

The thickness of the transparent conductive layer (ITO layer) was calculated by measuring X-ray reflectivity, and analyzing the obtained measurement data with an analysis software (manufactured by Rigaku Corporation, "GXRR 3") using X-ray reflectivity method as the principle of measurement under the following measurement conditions with a powder X-RAY diffraction device (manufactured by Rigaku Corporation, "RINT-2000"). The analysis conditions used were as follows. A two-layer model of a PET film and an ITO layer having a density of 7.1 g/cm$^3$ was used. The thickness and the surface roughness of the ITO layer were used as variants. A least squares fitting was performed and the thickness of the transparent conductive layer was analyzed. Table 1 shows the results.

[Measurement Conditions]

Light source: Cu-Kα ray (wavelength: 1,5418 Å), 40 kV, 40 mA

Optical system: parallel beam optical system

Divergent slit: 0.05 mm

Acceptance slit: 0.05 mm

Monochromatization and parallelization: used multilayer Goebel mirror

Measurement mode: θ/2θ scanning mode

Measurement range (2θ): 0.3 to 2.0°

[Analysis Conditions]

Analysis method: least squares fitting

Analysis range (2θ): 2θ=0.3 to 2.0°

(Measurement on surface roughness)

The surface roughness (nm) of the first optical adjustment layer, the transparent conductive layer, and the inorganic substance layer was measured by using an atomic force microscope (manufactured by Digital Instruments, "Dimension 3100", hereinafter referred to as AFM.) under normal temperature with the 1 μm square image under Tapping AFM mode. The arithmetic average roughness Ra of the plane was obtained by automatic calculation with offline mode of the attached software based on the obtained image. Table 1 shows the results.

(Measurement of Specific Resistance)

The surface resistance (Ω/□) of the transparent conductive layer was measured by four terminal sensing in accordance with JIS K 7194 (1994). The specific resistance of the transparent conductive layer was calculated based on the surface resistance obtained from this measurement and the thickness of the transparent conductive layer calculated as described above. Table 1 shows the results.

TABLE 1

| | Second optical adjustment layer | | First optical adjustment layer | | | Inorganic substance layer | | Transparent conductive layer | | |
|---|---|---|---|---|---|---|---|---|---|---|
| | Thickness [nm] | Refraction | Thickness [nm] | Refraction | Presence or absence of particles | Surface roughness [nm] | Thickness [nm] | Surface roughness [nm] | Thickness [nm] | Surface roughness [nm] | Specific resistance [Ω · cm] |

| | Thickness [nm] | Refraction | Thickness [nm] | Refraction | Presence or absence of particles | Surface roughness [nm] | Thickness [nm] | Surface roughness [nm] | Thickness [nm] | Surface roughness [nm] | Specific resistance [Ω · cm] |
|---|---|---|---|---|---|---|---|---|---|---|---|
| Ex. 1 | 200 | 1.75 | 25 | 1.52 | Absent | 0.73 | 1 | 0.32 | 26 | 0.67 | $1.7 \times 10^{-4}$ |
| Ex. 2 | 200 | 1.75 | 25 | 1.52 | Absent | 0.73 | 2 | 0.24 | 26 | 0.33 | $1.6 \times 10^{-4}$ |
| Ex. 3 | 200 | 1.75 | 25 | 1.52 | Absent | 0.73 | 3 | 0.26 | 26 | 0.37 | $1.6 \times 10^{-4}$ |
| Ex. 4 | 200 | 1.75 | 25 | 1.52 | Absent | 0.73 | 4 | 0.33 | 26 | 0.61 | $1.7 \times 10^{-4}$ |
| Ex. 5 | 200 | 1.75 | 25 | 1.52 | Absent | 0.73 | 6 | 0.50 | 26 | 1.07 | $2.1 \times 10^{-4}$ |
| Ex. 6 | 200 | 1.75 | 25 | 1.52 | Absent | 0.73 | 9 | 0.57 | 26 | 1.28 | $2.3 \times 10^{-4}$ |
| Ex. 7 | — | — | 25 | 1.52 | Absent | 0.70 | 3 | 0.29 | 26 | 0.40 | $1.7 \times 10^{-5}$ |
| Ex. 8 | — | — | 100 | 1.52 | Absent | 0.65 | 3 | 0.44 | 26 | 1.05 | $2.4 \times 10^{-6}$ |
| Comp. Ex. 1 | 200 | 1.75 | 25 | 1.52 | Absent | 0.73 | — | 0.73*[1] | 26 | 1.43 | $2.6 \times 10^{-4}$ |
| Comp. Ex. 2 | 200 | 1.75 | 25 | 1.52 | Absent | 0.73 | 11 | 0.80 | 26 | 1.45 | $2.6 \times 10^{-4}$ |
| Comp. | 200 | 1.75 | 25 | 1.52 | Absent | 0.73 | 15 | 0.84 | 26 | 1.48 | $2.8 \times 10^{-4}$ |

TABLE 1-continued

| | Second optical adjustment layer | | First optical adjustment layer | | | | Inorganic substance layer | | Transparent conductive layer | | |
|---|---|---|---|---|---|---|---|---|---|---|---|
| | Thickness [nm] | Refraction | Thickness [nm] | Refraction | Presence or absence of particles | Surface roughness [nm] | Thickness [nm] | Surface roughness [nm] | Thickness [nm] | Surface roughness [nm] | Specific resistance [Ω·cm] |
| Ex. 3 Comp. Ex. 4 | 200 | 1.75 | 25 | 1.52 | Absent | 0.73 | 20 | 1.12 | 26 | 1.55 | $3.0 \times 10^{-4}$ |
| Comp. Ex. 5 | 200 | 1.75 | 25 | 1.52 | Present | 1.39 | — | 1.39*1 | 26 | 1.63 | $3.2 \times 10^{-4}$ |
| Comp. Ex. 6 | 200 | 1.75 | 25 | 1.52 | Present | 1.39 | 3 | 1.32 | 26 | 1.52 | $2.8 \times 10^{-4}$ |
| Comp. Ex. 7 | 20 | 2.3 | 25 | 1.76 | Absent | 1.28 | 3 | 1.34 | 26 | 1.66 | $3.3 \times 10^{-4}$ |

*1 Surface roughness of the upper face of the first optical adjustment layer

While the illustrative embodiments of the present invention are provided in the above description, such is for illustrative purpose only and it is not to be construed as limiting in any manner. Modification and variation of the present invention that will be obvious to those skilled in the art is to be covered by the following claims.

INDUSTRIAL APPLICABILITY

The transparent conductive film of the present invention can be used for various industrial products. For example, the transparent conductive film of the present invention can be suitably used for films for a touch panel incorporated in image display devices.

DESCRIPTION OF REFERENCE NUMERALS

1. Transparent conductive film
2. Transparent substrate
3. Second optical adjustment layer
4. First optical adjustment layer
5. Inorganic substance layer
6. Transparent conductive layer.

The invention claimed is:

1. A transparent conductive film comprising:
a transparent substrate which is a polymer film,
a first optical adjustment layer disposed on one side, in the thickness direction of the transparent conductive film, of the transparent substrate and made of a resin layer,
an inorganic substance layer disposed on one side, in the thickness direction of the transparent conductive film, of the first optical adjustment layer so as to make contact with the first optical adjustment layer, and
a transparent conductive layer disposed directly on one side, in the thickness direction of the transparent conductive film, of the inorganic substance layer,
wherein the inorganic substance layer has a thickness of 10 nm or less,
the surface of the one side, in the thickness direction of the transparent conductive film, of the transparent conductive layer has a surface roughness of 1.40 nm or less, and
the first optical adjustment layer does not substantially contain particles.
2. The transparent conductive film according to claim 1, wherein the first optical adjustment layer has a thickness of less than 200 nm.
3. The transparent conductive film according to claim 1, wherein the surface of the one side, in the thickness direction of the transparent conductive film, of the inorganic substance layer has a surface roughness of 0.20 nm or more and 0.70 nm or less.
4. The transparent conductive film according to claim 1, further comprising a second optical adjustment layer,
wherein the second optical adjustment layer is disposed on one side, in the thickness direction of the transparent conductive film, of the transparent substrate and on the other side, in the thickness direction of the transparent conductive film, of the first optical adjustment layer, and
the second optical adjustment layer has a refraction that is different from the refraction of the first optical adjustment layer.
5. The transparent conductive film according to claim 4, wherein the first optical adjustment layer has a refraction that is lower than the refraction of the second optical adjustment layer.
6. The transparent conductive film according to claim 1, wherein the transparent conductive layer has a thickness of 25 nm or more and 40 nm or less.
7. The transparent conductive film according to claim 1, wherein the transparent conductive layer has a specific resistance of $1.1 \times 10^{-4}$ Ω·cm or more and $2.5 \times 10^{-4}$ Ω·cm or less.
8. The transparent conductive film according to claim 4, wherein the second optical adjustment layer is made of a resin layer.
9. The transparent conductive film according to claim 4, wherein the second optical adjustment layer comprises of a resin and particles.
10. The transparent conductive film according to claim 4, wherein the second optical adjustment layer has a thickness of 30 nm to 1000 nm.
11. The transparent conductive film according to claim 4, wherein the difference between the refraction of the first optical adjustment layer and the refraction of the second optical adjustment layer is 0.10 to 0.60.
12. The transparent conductive film according to claim 1, wherein the inorganic substance layer is composed of an inorganic substance selected from the group consisting of alkali metal fluorides, alkaline earth metal fluorides, rare earth element fluorides, oxides and mixtures thereof.

* * * * *